(12) United States Patent
Carlson

(10) Patent No.: US 9,406,538 B2
(45) Date of Patent: Aug. 2, 2016

(54) INDEXED INLINE SUBSTRATE PROCESSING TOOL

(71) Applicant: APPLIED MATERIALS, INC., Santa Clara, CA (US)

(72) Inventor: David K. Carlson, San Jose, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 169 days.

(21) Appl. No.: 14/034,921

(22) Filed: Sep. 24, 2013

(65) Prior Publication Data

US 2014/0099778 A1 Apr. 10, 2014

Related U.S. Application Data

(60) Provisional application No. 61/711,493, filed on Oct. 9, 2012.

(51) Int. Cl.

| | |
|---|---|
| *C23C 16/458* | (2006.01) |
| *C23C 16/48* | (2006.01) |
| *C23C 16/54* | (2006.01) |
| *H01L 21/673* | (2006.01) |
| *H01L 21/677* | (2006.01) |
| *H01L 21/67* | (2006.01) |

(52) U.S. Cl.
CPC ........ *H01L 21/6776* (2013.01); *C23C 16/4587* (2013.01); *C23C 16/481* (2013.01); *C23C 16/54* (2013.01); *H01L 21/67115* (2013.01); *H01L 21/67712* (2013.01); *H01L 21/67173* (2013.01)

(58) Field of Classification Search
CPC ................... H01L 21/67173; H01L 21/67712; C23C 16/4587
See application file for complete search history.

(56) References Cited

U.S. PATENT DOCUMENTS 4,808,554 A * 2/1989 Yamazaki ...................... 438/483
5,097,794 A * 3/1992 Mahler et al. .................. 118/719
(Continued)

FOREIGN PATENT DOCUMENTS

JP 63-303062 A 12/1988
JP 06-151413 A 5/1994
(Continued)

OTHER PUBLICATIONS

International Search Report and Written Opinion mailed Jan. 9, 2014 for PCT Application No. PCT/US2013/061404.
(Continued)

*Primary Examiner* — Karla Moore
(74) *Attorney, Agent, or Firm* — Moser Taboada; Alan Taboada

(57) ABSTRACT

In some embodiments, an indexed inline substrate processing tool may include a substrate carrier having a base and pair of opposing substrate supports having respective substrate support surfaces that extend upwardly and outwardly from the base; and a plurality of modules coupled to one another in a linear arrangement, wherein each module of the plurality of modules comprises an enclosure having a first end, a second end, and a lower surface to support the substrate carrier and to provide a path for the substrate carrier to move linearly through the plurality of modules, and wherein at least one module of the plurality of modules comprises: a window disposed in a side of the enclosure; a heating lamp coupled to the side of the enclosure; a gas inlet disposed proximate a top of the enclosure; and an exhaust disposed opposite the gas inlet.

13 Claims, 3 Drawing Sheets

(56) References Cited

U.S. PATENT DOCUMENTS

| | | | |
|---|---|---|---|
| 5,288,329 A * | 2/1994 | Nakamura | C23C 16/54 |
| | | | 118/715 |
| 5,444,217 A * | 8/1995 | Moore et al. | 219/405 |
| 5,626,677 A * | 5/1997 | Shirahata | 118/719 |
| 6,117,266 A * | 9/2000 | Horzel et al. | 156/345.31 |
| 6,262,393 B1 * | 7/2001 | Imai | C23C 16/458 |
| | | | 118/50.1 |
| RE42,830 E | 10/2011 | Matsushita et al. | |
| 8,652,259 B2 * | 2/2014 | Poppe et al. | 118/728 |
| 9,111,980 B2 * | 8/2015 | Carlson | H01L 21/67017 |
| 2006/0099827 A1 | 5/2006 | Yoo | |
| 2010/0065111 A1 | 3/2010 | Fu et al. | |
| 2010/0092697 A1 | 4/2010 | Poppe et al. | |
| 2010/0108134 A1 | 5/2010 | Ravi | |
| 2010/0189532 A1 | 7/2010 | Watanabe et al. | |
| 2010/0215872 A1 | 8/2010 | Sivaramakrishnan et al. | |
| 2010/0263587 A1 | 10/2010 | Sivaramakrishnan et al. | |
| 2011/0097518 A1 * | 4/2011 | Olgado | C23C 16/4587 |
| | | | 427/575 |
| 2011/0277688 A1 | 11/2011 | Trujillo et al. | |
| 2011/0277690 A1 | 11/2011 | Rozenzon et al. | |
| 2011/0283941 A1 | 11/2011 | Rozenzon et al. | |
| 2011/0315186 A1 | 12/2011 | Gee et al. | |
| 2012/0000511 A1 | 1/2012 | Gee et al. | |

FOREIGN PATENT DOCUMENTS

| | | |
|---|---|---|
| JP | 2001118907 A * | 4/2001 |
| WO | WO2011-136525 A3 | 1/2012 |
| WO | WO 2012025607 A1 * | 3/2012 |

OTHER PUBLICATIONS

U.S. Appl. No. 13/721,311, filed Dec. 20, 2012, Carlson.
U.S. Appl. No. 13/721,323, filed Dec. 20, 2012, Carlson.
U.S. Appl. No. 13/721,332, filed Dec. 20, 2012, Carlson.

* cited by examiner

INDEXED INLINE SUBSTRATE PROCESSING TOOL

CROSS-REFERENCE TO RELATED APPLICATIONS

This application claims benefit of U.S. provisional patent application Ser. No. 61/711,493, filed Oct. 9, 2012, which is herein incorporated by reference.

FIELD

Embodiments of the present invention generally relate to semiconductor processing equipment.

BACKGROUND

Conventional substrate processing systems often utilize single process chambers to perform multiple steps of a process. For example, a single process chamber may be utilized to rapidly heat, deposit material, and subsequently cool down a substrate. However, the inventor has observed that the continuous heating, cooling, and provision of different process resources required to perform the aforementioned tasks causes the system to be energy inefficient and, therefore, costly to operate.

Therefore, the inventor has provided embodiments of an indexed inline substrate processing tool that may address some or all of the aforementioned problems.

SUMMARY

An indexed inline substrate processing tool and methods or use thereof are provided herein. In some embodiments, an indexed inline substrate processing tool may include a substrate carrier having a base and pair of opposing substrate supports having respective substrate support surfaces that extend upwardly and outwardly from the base; and a plurality of modules coupled to one another in a linear arrangement, wherein each module of the plurality of modules comprises an enclosure having a first end, a second end, and a lower surface to support the substrate carrier and to provide a path for the substrate carrier to move linearly through the plurality of modules from a first module of the plurality of modules, through any intervening modules, to a last module of the plurality of modules, and wherein at least one module of the plurality of modules comprises: a window disposed in a side of the enclosure to allow radiant heat to be provided into the enclosure; a heating lamp coupled to the side of the enclosure to provide radiant heat into the enclosure through the window; a gas inlet disposed proximate a top of the enclosure to provide a process gas into the enclosure; and an exhaust disposed opposite the gas inlet to remove the process gas from the enclosure.

In some embodiments, a method of depositing a material on a substrate in an indexed inline epitaxial deposition tool, the indexed inline epitaxial deposition tool comprising a plurality of modules coupled to one another in a linear arrangement, wherein each module of the plurality of modules comprises an enclosure having a first end, a second end, and a lower surface to support a substrate carrier and to provide a path for the substrate carrier to move linearly through the plurality of modules from a first module of the plurality of modules, through any intervening modules, to a last module of the plurality of modules, and wherein at least one module of the plurality of modules comprises a window disposed in a side of the enclosure to allow radiant heat to be provided into the enclosure, a heating lamp coupled to the side of the enclosure to provide radiant heat into the enclosure through the window, a gas inlet disposed proximate a top of the enclosure to provide a process gas into the enclosure and an exhaust disposed opposite the gas inlet to remove the process gas from the enclosure, may include providing the substrate carrier to a first module of the plurality of modules, the substrate carrier having a first set of substrates disposed in the substrate carrier; performing a first step of an epitaxial deposition process on the first set of substrates; providing a second substrate carrier having a second set of substrates disposed in the second substrate carrier to the first module, wherein the second substrate carrier pushes the first substrate carrier to a second module of the plurality of modules; and performing the first step of the epitaxial deposition process on the second set of substrates in the first module while performing a second step of the epitaxial deposition process on the first set of substrates in the second module.

Other and further embodiments of the present invention are described below.

BRIEF DESCRIPTION OF THE DRAWINGS

Embodiments of the present invention, briefly summarized above and discussed in greater detail below, can be understood by reference to the illustrative embodiments of the invention depicted in the appended drawings. It is to be noted, however, that the appended drawings illustrate only typical embodiments of this invention and are therefore not to be considered limiting of its scope, for the invention may admit to other equally effective embodiments.

Figure 1:
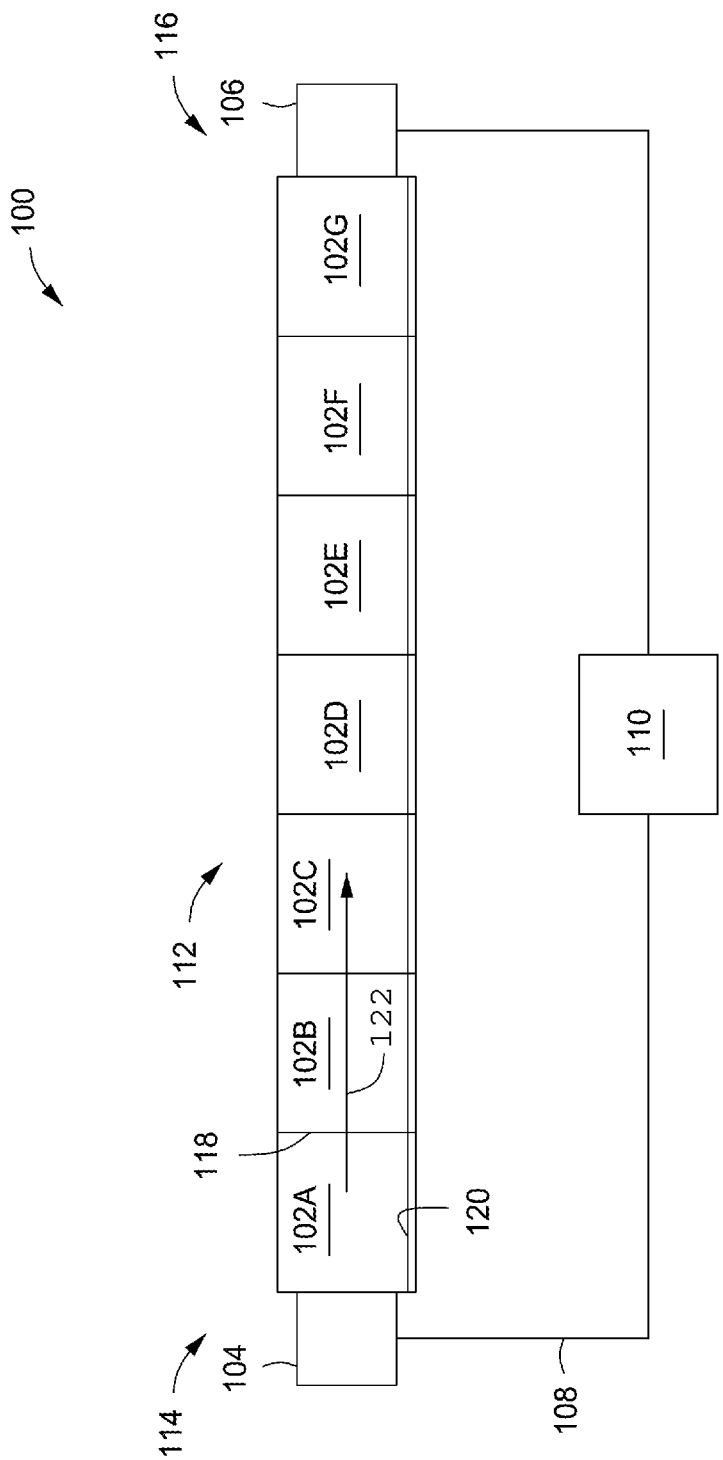
FIG. 1 depicts an indexed inline substrate processing tool in accordance with some embodiments of the present invention.

To facilitate understanding, identical reference numerals have been used, where possible, to designate identical elements that are common to the figures. The figures are not drawn to scale and may be simplified for clarity. It is contemplated that elements and features of one embodiment may be beneficially incorporated in other embodiments without further recitation.

DETAILED DESCRIPTION

Embodiments of indexed inline substrate processing tools and methods of use thereof are provided herein. The inventive indexed inline substrate processing tool advantageously provides cost effective and simple manufacturability and an energy and cost efficient usage, as compared to conventional substrate processing tools utilized to perform multi-step substrate processes. While not limiting in scope, the inventor believes that the inventive indexed inline substrate processing tool may be particularly advantageous for processing larger size substrates, for example such as 450 mm and larger semiconductor substrates, glass panel substrates, or the like.

FIG. 1 is an indexed inline substrate processing tool 100 in accordance with some embodiments of the present invention. The indexed inline substrate processing tool 100 may generally be configured to perform any process on a substrate for a desired semiconductor application. For example, in some embodiments, the indexed inline substrate processing tool 100 may be configured to perform one or more deposition processes, for example, such as an epitaxial deposition process.

The indexed inline substrate processing tool 100 generally comprises a plurality of modules 112 (first module 102A, second module 102B, third module 102C, fourth module 102D, fifth module 102E, six module 102F, and seventh module 102G shown) coupled together in a linear arrangement. A substrate may move through the indexed inline substrate processing tool 100 as indicated by the arrow 122. In some embodiments, one or more substrates may be disposed on a substrate carrier, for example, such as the substrate carrier 502 described below with respect to FIG. 5 to facilitate movement of the one or more substrates through the indexed inline substrate processing tool 100.

Each of the plurality of modules 112 may be individually configured to perform a portion of a desired process. By utilizing each of the modules to perform only a portion of a desired process, each module of the plurality of modules 112 may be specifically configured and/or optimized to operate in a most efficient manner with respect to that portion of the process, thereby making the indexed inline substrate processing tool 100 more efficient as compared to conventionally used tools utilized to perform multi-step processes.

In addition, by performing a portion of a desired process in each module, process resources (e.g., electrical power, process gases, or the like) provided to each module may be determined by the amount of the process resource required only to complete the portion of the process that the module is configured to complete, thereby further making the inventive indexed inline substrate processing tool 100 more efficient as compared to conventionally used tools utilized to perform multi-step processes.

In an exemplary configuration of the indexed inline substrate processing tool 100, in some embodiments, the first module 102A may be configured to provide a purge gas to, for example, remove impurities from the substrate and/or substrate carrier and/or introduce the substrate into a suitable atmosphere for deposition. The second 102B module may be configured to preheat or perform a temperature ramp to raise a temperature of the substrate to a temperature suitable for performing the deposition. The third module 102C may be configured to perform a bake to remove volatile impurities from the substrate prior to the deposition of the materials. The fourth module 102D may be configured to deposit a desired material on the substrate. The fifth module 102E may be configured to perform a post-deposition process, for example such as an annealing process. The sixth module 102F may be configured to cool the substrate. The seventh module 102G may be configured to provide a purge gas to, for example, remove process residues from the substrate and/or substrate carrier prior to removal from the indexed inline substrate processing tool 100. In embodiments where certain processes are not needed, the module configured for that portion of the process may be omitted. For example, if no anneal is needed after deposition, the module configured for annealing (e.g., the fifth module 102E in the exemplary embodiment above) may be may be omitted or may be replaced with a module configured for a different desired process.

Some or all of the plurality of modules may be isolated or shielded from adjacent modules, for example by a barrier 118, to facilitate maintaining an isolated processing volume with respect to other modules in the indexed inline substrate processing tool 100. For example, in some embodiments, the barrier 118 may be a gas curtain, such as of air or of an inert gas, provided between adjacent modules to isolate or substantially isolate the modules from each other. In some embodiments, the barrier 118 may be a gate or door may that can open to allow the substrate carrier to move from one module to the next, and can be closed to isolate the module. In some embodiments, the indexed inline substrate processing tool 100 may include both gas curtains and gates, for example, using gas curtains to separate some modules and gates to separate other modules, and/or using gas curtains and gates to separate some modules.

In some embodiments, isolation is provided by purge gas curtains using nitrogen or argon gas depending on the location of the gas curtain. For example, the gas curtain in the hotter processing regions would be formed using argon gas. The gas curtains in colder regions near the gates, away from the hotter processing regions, could by nitrogen to minimize cost of operation. The nitrogen gas curtains can only be used in cold, inert sections of each module.

The gate provides additional isolation for certain processes, for example, during the deposition part of the sequence. The gates in hotter regions of the processing system can be made out of quartz to withstand the high temperatures. In order to provide a reflective gate to reflect energy back toward the processing region (and to keep the gate cool), a composite gate can be provided. For example, a nickel film or a reflective quartz material may be disposed between two quartz plates. For other regions, the gates can be fabricated from other process compatible materials, such as polished stainless steel.

In some embodiments, a load module 104 may be disposed at a first end 114 of the indexed inline substrate processing tool 100 and an unload module 106 may be disposed at a second end 116 of the indexed inline substrate processing tool 100. When present, the load module 100 and unload module 106 may facilitate providing a substrate to, and removing a substrate from, the indexed inline substrate processing tool 100, respectively. In some embodiments, the load module 104 and the unload module 106 may provide vacuum pump down and back to atmospheric pressure functions to facilitate transfer of substrates from atmospheric conditions outside of the indexed inline substrate processing tool 100 to conditions within the indexed inline substrate processing tool 100 (which may include vacuum pressures). In some embodiments, one or more substrate carrier transfer robots may be utilized to provide and remove the substrate carrier from the load module 104 and the unload module 106, thereby providing an automated loading and unloading of the substrate carrier to and from the indexed inline substrate processing tool 100.

In some embodiments, a track 120 may be provided along the axial length of the indexed inline substrate processing tool 100 to facilitate guiding the substrate carrier through the indexed inline substrate processing tool 100. The track 120 may be provided along a floor of a facility or other base surface upon which the indexed inline substrate processing tool 100 is mounted. In such embodiments, each module may be configured to be assembled such that the track 120 may be positioned along an exposed bottom portion of the module to facilitate moving the substrate carrier along the track 120 and through each respective module. Alternatively, the track 120 may be mounted to a bottom surface of the modules once assembly in a linear array. Alternatively, portions of the track 120 may be mounted to a bottom surface of each individual module such that the complete track 120 is formed after assembly of all of the modules in a linear array. In some embodiments, the track 120 may include rollers to facilitate low friction movement of the substrate carrier along the track 120. In some embodiments, the track 120 may be fabricated from or may be coated with a low friction material, such as described below with respect to FIG. 2, to facilitate low friction movement of the substrate carrier along the track 120.

In some embodiments, a cleaning module 110 may be disposed between the load module 100 and the unload module 106. When present, the cleaning module 110 may clean and/or prepare the substrate carrier to receive another one or more substrates for a subsequent run through the indexed inline substrate processing tool 100 (as indicated by the return path arrow 108). As such, the substrate carriers may be reused multiple times.

Figure 2:
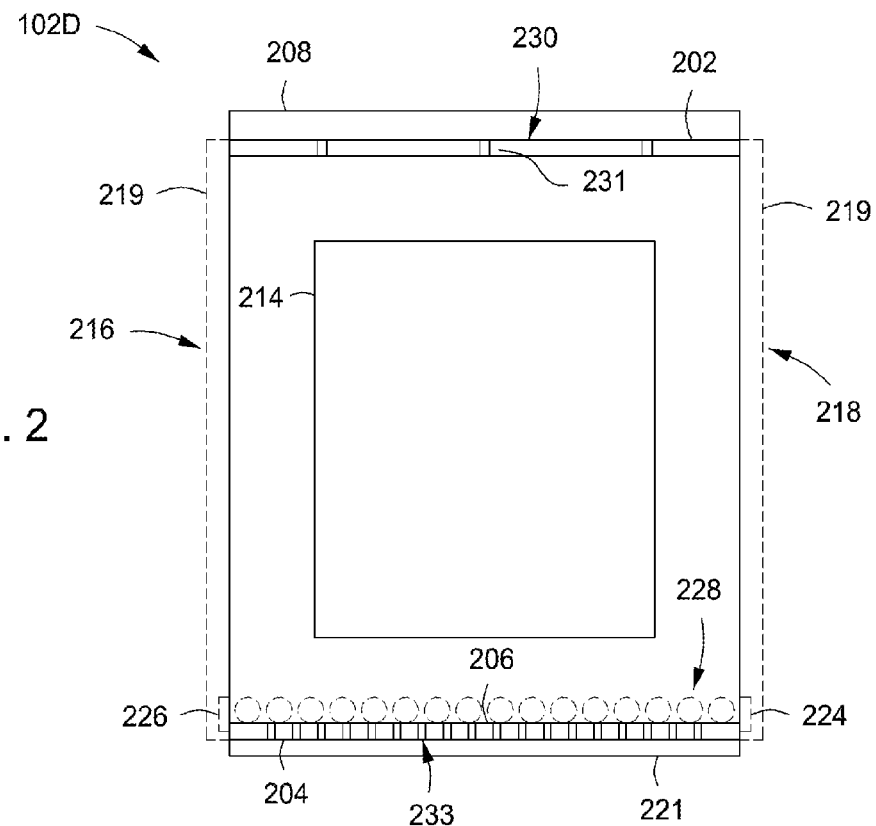
FIG. 2 is a cross sectional view of a module of an indexed inline substrate processing tool in accordance with some embodiments of the present invention.

FIG. 2 depicts a cross sectional view of an exemplary configuration of a module, such as module 102D, that may be used as one or more of the modules of the plurality of modules 112 described above, and in some embodiments, as a module configured for the deposition of materials on a substrate. Although generally discussed below in terms of a specific module (102E), the below discussion generally applies to all modules with the exception of components and/or configurations only specifically required for a deposition process.

Referring to FIG. 2, in some embodiments, the module 102D may generally comprises an enclosure 202. The enclosure 202 may be fabricated from any material suitable for semiconductor processing, for example, a metal such as aluminum, stainless steel, or the like. The enclosure 202 may have any dimensions suitable to accommodate a substrate carrier (e.g., substrate carrier 502 described below) configured to carry one or more substrates of a given size as well as to facilitate a desired flow rate and profile. For example in some embodiments, the enclosure may have a height and length of about 24 inches or about 36 inches and a depth of about 6 inches.

In some embodiments, the enclosure 202 may be assembled by coupling a plurality of plates together to form the enclosure 202. Each enclosure 202 may be configured to form a particular module (e.g., module 102D) that is capable of performing a desired portion of a process. By assembling the enclosure 202 in such a manner, the enclosure 202 may be produced in multiple quantities for multiple applications via a simple and cost effective process.

A lower surface 206 of the enclosure supports the substrate carrier and provides a path for the substrate carrier to move linearly through the module 102D to an adjacent module of the plurality of modules. In some embodiments, the lower surface 206 may be configured as the track 120. In some embodiments, the lower surface 206 may have the track 120, or a portion thereof, coupled to the lower surface 206. In some embodiments, the lower surface 206, or the track 120, may comprise a coating, for example, a dry lubricant such as a nickel alloy (NiAl) containing coating, to facilitate movement of the substrate carrier through the module 102D. Alternatively, or in combination, in some embodiments, a plurality of rollers (shown in phantom at 228) may be disposed above the lower surface 206 to facilitate movement of the substrate carrier through the module 102D. In such embodiments, the plurality of rollers 228 may be fabricated from any material that is non-reactive to the process environment, for example, such as quartz ($SiO_2$).

In some embodiments, a barrier 219 may be disposed proximate the first end 216 and/or second end 218 of the enclosure 202 (e.g., to form the barrier 118 as shown in FIG. 1). When present, the barrier 219 isolates each module of the plurality of modules from an adjacent module to prevent cross contamination or mixing of environments between modules. In some embodiments, the barrier 219 may be a stream of gas, for example a purge gas, provided by a gas inlet (e.g., such as the gas inlet 208) disposed above the module 102D. Alternatively, or in combination, in some embodiments, the barrier 219 may be a movable gate. In such embodiments, the gate may be fabricated from a metal, such as aluminum, stainless steel, or the like. In some embodiments, one or more sides of the gate may comprise a reflective coating to minimize heat loss from the module 102D. In some embodiments, one or more notches (two notches 224, 226 shown) may be formed in the gate to facilitate securing the substrate carrier in a desired position within the module 102D and/or to form a seal between the substrate carrier and the barrier 219 during processing.

In some embodiments, the module 102D may comprise one or more windows disposed in one or more sides of the enclosure, for example such, as the window 214 disposed in the side 220 of the enclosure 202, as shown in FIG. 2. When present, the window 214 allows radiant heat to be provided into the enclosure 202 from, for example, a radiant heat lamp disposed on a side of the window 214 opposite the interior of the enclosure 202. The window 214 may be fabricated from any material suitable to allow the passage of radiant heat through the window 214 while resisting degradation when exposed to the processing environment within the enclosure 202. For example, in some embodiments, the window 214 may be fabricated from quartz ($SiO_2$).

In some embodiments, the module 102D may include a gas inlet 208 disposed proximate a top 230 of the enclosure 202 to provide a process gas into the enclosure 202 via through holes 231 formed in the enclosure 202. The gas inlet 208 may be configured in any manner suitable to provide a desired process gas flow to the enclosure 202.

Figure 4:
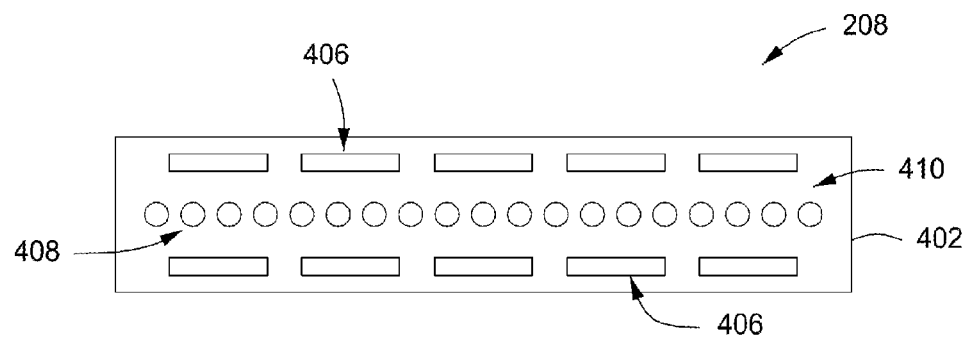
FIG. 4 is a gas inlet of an indexed inline substrate processing tool in accordance with some embodiments of the present invention.

For example, referring to FIG. 4, in some embodiments, the gas inlet 208 may comprise a body 402 having a plurality of gas orifices 410. The body 402 may be fabricated from any suitable material, for example, such as quartz ($SiO_2$). The gas orifices 410 may be configured to provide a desired flow of process gases and/or purge gases into the enclosure 202. For example, in some embodiments, the gas orifices 410 may comprise inner gas holes 408 and outer gas slots 406, such as shown in FIG. 4. In such embodiments, the inner gas holes 408 may provide a jet flow of process gases to a central area of the enclosure 202 to facilitate a process. The outer gas slots 406 may provide a laminar flow of purge gas to one or more cold zones within the enclosure (e.g., proximate the windows 214 described above) to reduce or eliminate deposition of materials within the cold zones.

Referring back to FIG. 2, in some embodiments, the module 102D may comprise an exhaust 221 coupled to a portion of the enclosure 202 opposite the gas inlet 208 (e.g. the bottom 204) to facilitate the removal gases from the enclosure 202 via passageways 233 formed in the bottom 204 of the enclosure 202.

Figure 3:
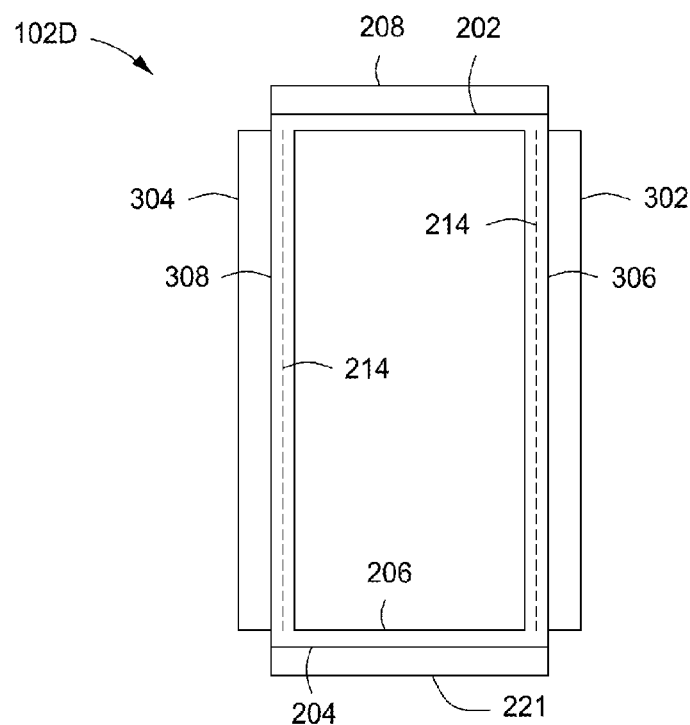
FIG. 3 is a module of an indexed inline substrate processing tool in accordance with some embodiments of the present invention.

Referring to FIG. 3, in some embodiments, the module 102D may include one or more heating lamps (two heating lamps 302, 304 shown) coupled to the sides 306, 308 of the enclosure 202. The heating lamps 302, 304 provide radiant heat into to enclosure 202 via the windows 214. The heating lamps 302, 304 may be any type of heating lamp suitable to provide sufficient radiant heat into the enclosure to perform a desired portion of a process within the module 102D. For example, in some embodiments, the heating lamps 302, 304 may be linear lamps or zoned linear lamps capable of providing radiant heat at a wavelength of about 0.9 microns, or in some embodiments, about 2 microns. The wavelengths used for lamps in various modules may be selected based upon the desired application. For example, the wavelength may be selected to provide a desired filament temperature. Low wavelength bulbs are less expensive, use less power, and can be used for preheating. Longer wavelength bulbs provide high power to facilitate providing higher process temperatures, for example, for deposition processes.

Figure 5:
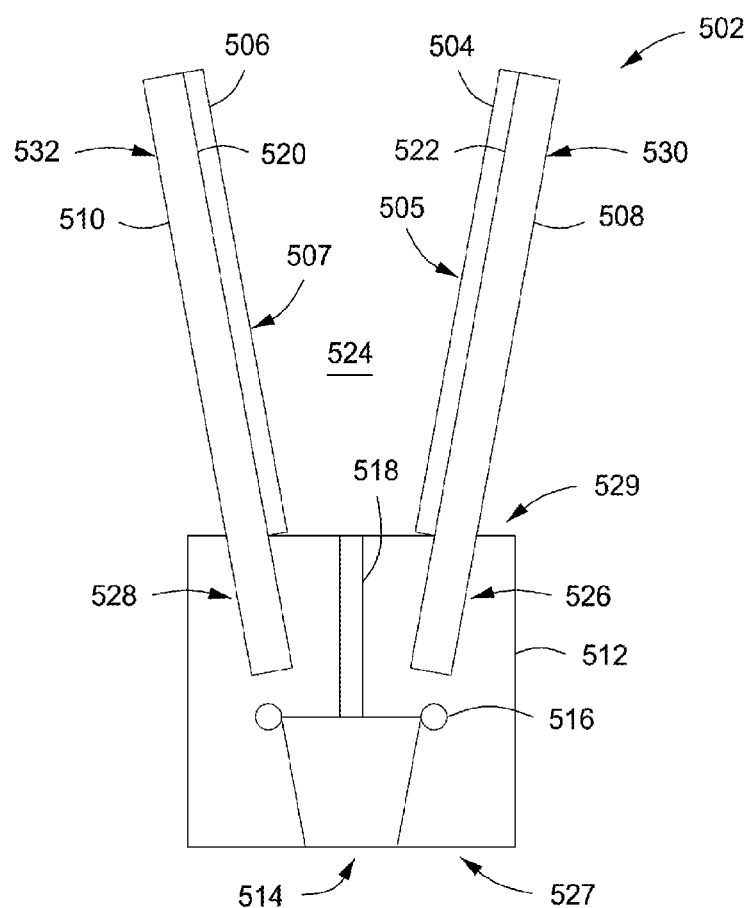
FIG. 5 is a substrate carrier for use in an indexed inline substrate processing tool in accordance with some embodiments of the present invention.

Referring to FIG. 5, in some embodiments, a substrate carrier 502 may be provided to support two or more substrates and to carry the two or more substrates through the indexed inline substrate processing tool 100. In some embodiments, the substrate carrier 502 may generally include a base 512 and a pair of opposing substrate supports 508, 510. One or more substrates, (substrate 504, 506 shown in FIG. 5) may be disposed on each of the substrate supports 508, 510 for processing.

The base 512 may be fabricated from any material suitable to support the substrate supports 508, 510 during processing, for example such as graphite. In some embodiments, a first slot 526 and a second slot 528 may be formed in the base 512 to allow for the substrate supports 508, 510 to be at least partially disposed within the first slot 526 and second slot 528 to retain the substrate supports 508, 510 in a desired position for processing. The substrate supports 508, 510 are generally slightly angled outwardly such that the substrate supporting surfaces generally oppose each other and are arranged in a "v" shape. The base 512 needs to be insulating and will be either clear or opaque quartz or a combination of clear and opaque quartz for temperature management.

A channel 514 is disposed in a bottom surface 527 of the base 512 and an opening 518 is disposed through the base 512 from a top surface 529 of the base 512 to the channel 514 to form a path for one or more gases to flow through the base 512. For example, when the substrate carrier 502 is disposed in a module, such as the module 102D described above, the opening 518 and channel 514 facilitates a flow of gas from a gas inlet (e.g., gas inlet 208 described above) to an exhaust of the module (e.g., exhaust 221 of module 102D described above). The carriage may be fabricated from quartz with the exhaust and cleaning channels machined into the quartz or a metal base disposed below the quartz. A baffle may be provided to facilitate evening out the flow through the base 512.

In some embodiments, the base 512 may include a conduit 516 disposed within the base 512 and circumscribing the channel 514. The conduit 516 may have one or more openings formed along the length of the conduit 516 to fluidly couple the conduit 516 to the channel 514 to allow a flow of gas from the conduit 516 to the channel 514. In some embodiments, while the substrate carrier 502 is disposed in a module, a cleaning gas may be provided to the conduit 516 and channel 514 to facilitate removal of deposited material from the channel 514. The cleaning gas may be any gas suitable to remove a particular material from the module. For example, in some embodiments the cleaning gas may comprise one more chlorine containing gases, such as hydrogen chloride (HCl), chlorine gas ($Cl_2$), or the like. Alternatively, in some embodiments, an inert gas may be provided to the conduit 516 and channel 514 to minimize deposition of material on the channel 514 by forming a barrier between the exhaust gases flowing through the channel and the surfaces of the channel.

The substrate supports 508, 510 may be fabricated from any material suitable to support a substrate 504, 506 during processing. For example, in some embodiments, the substrate supports 508, 510 may be fabricated from graphite. In such embodiments, the graphite may be coated, for example with silicon carbide (SiC), to provide resistance to degradation and/or to minimize substrate contamination.

The opposing substrate supports 508, 510 comprise respective substrate support surfaces 520, 522 that extend upwardly and outwardly from the base 512. Thus, when substrates 504, 506 are disposed on the substrate supports 508, 510, a top surface 505, 507 of each of the substrates 504, 506 face one another. Facing the substrates 504, 506 toward one another during processing advantageously creates a radiant cavity between the substrates (e.g. in the area 524 between the substrate supports 508, 510) that provides an equal and symmetrical amount of heat to both substrates 504, 506, thus promoting process uniformity between the substrates 504, 506.

In some embodiments, during processing, process gases are provided to the area 524 between the substrate supports 508, 510 while a heat source disposed proximate a back side 530, 532 of the substrate supports 508, 510 (e.g., the heating lamps 302, 304 described above) provides heat to the substrates 504, 506. Providing the process gases to the area 524 between the substrate supports 508, 510 advantageously reduces exposure of the process gases to interior components of the modules, thus reducing material deposition on cold spots within the modules (e.g., the walls of the modules, windows, or the like) as compared to conventional processing systems that provide process gases between a heat source and substrate support. In addition, the inventor has observed that by heating the substrates 504, 506 via the back side 530, 532 of the substrate supports 508, 510 any impurities within the module will deposit on the back side 530, 532 of the substrate supports 508, 510 and not the substrates 504, 506, thereby advantageously allowing for the deposition of materials having high purity and low particle count atop the substrates 504, 506.

In operation of the indexed inline substrate processing tool 100 as described in the above figures, the substrate carrier 502 having a first set of substrates disposed in the substrate carrier 502 (e.g. substrates 504, 506) is provided to a first module (e.g. first module 102A). When present, a barrier (e.g., barrier 118 or barrier 219) on the first side and/or the second side of the first module may be closed or turned on to facilitate isolating the first module. A first portion of a process (e.g., a purge step of a deposition process) may then be performed on the first set of substrates. After the first portion of the process is complete, a second substrate carrier having a second set of substrates disposed in a second substrate carrier is provided to the first module. As the second substrate carrier is provided to the first module, the second substrate carrier pushes the first carrier to the second module (e.g., the second module 102B). The first portion of the process is then performed on the second set of substrates in the first module while a second portion of the process is performed on the first set of substrates in the second module. The addition of subsequent substrate carriers repeats to provide each substrate carrier to a fixed position (i.e., within a desired module), thus providing a mechanical indexing of the substrate carriers. As the process is completed in the substrate carriers may be removed from the indexed inline substrate processing tool 100 via an unload module (e.g., unload module 106).

While the foregoing is directed to embodiments of the present invention, other and further embodiments of the invention may be devised without departing from the basic scope thereof.

The invention claimed is:
1. An indexed inline substrate processing tool, comprising:
    a substrate carrier having:

a base disposed horizontally along a bottom portion of the indexed inline substrate processing tool;
a pair of opposing substrate supports having respective substrate support surfaces that extend upwardly and outwardly arranged in a "v" shape from a top surface of the base, wherein each of the pair of opposing substrate supports is only supported along a bottom portion of the substrate support, and wherein the pair of substrate supports are configured to support at least one substrate such that a top surface of each substrate disposed on a first substrate support of the pair of substrate supports faces a top surface of another substrate disposed on a second substrate support of the pair of substrate supports; and
a plurality of slots formed in the top surface of the base, wherein each of the plurality of substrate supports are partially disposed within a respective each of the plurality of slots; and
a plurality of modules coupled to one another in a linear arrangement, wherein each module of the plurality of modules comprises an enclosure having a first end, a second end, and a lower surface to support the substrate carrier and to provide a path for the substrate carrier to move linearly through the plurality of modules from a first module of the plurality of modules, through any intervening modules, to a last module of the plurality of modules, and wherein at least one module of the plurality of modules comprises:
a window disposed in a side of the enclosure to allow radiant heat to be provided into the enclosure;
a heating lamp coupled to the side of the enclosure to provide radiant heat into the enclosure through the window;
a gas inlet disposed proximate a top of the enclosure to provide a process gas into the enclosure; and
an exhaust disposed opposite the gas inlet to remove the process gas from the enclosure.

2. The indexed inline substrate processing tool of claim 1, wherein the base is fabricated from graphite.

3. The indexed inline substrate processing tool of claim 1, further comprising a barrier disposed between each module and an adjacent module of the plurality of modules to isolate each module from the adjacent module.

4. The indexed inline substrate processing tool of claim 3, wherein the barrier is one of a movable gate or a gas purge curtain.

5. The indexed inline substrate processing tool of claim 1, wherein each module of the plurality of modules are configured to perform one of a gas purge, substrate temperature ramp, substrate bake, material deposition, post material deposition treatment or substrate cool down.

6. The indexed inline substrate processing tool of claim 1, wherein the module further comprises a plurality of rollers on an inner surface of the plurality of modules to allow the substrate carrier to move through the plurality of modules.

7. The indexed inline substrate processing tool of claim 1, wherein the substrate carrier slides on a track through the plurality of modules.

8. The indexed inline substrate processing tool of claim 7, wherein the plurality of modules further comprise a lubricant disposed on an inner surface of at least one module of the plurality of modules.

9. The indexed inline substrate processing tool of claim 1, wherein the plurality of modules further comprise a quartz liner disposed on an inner surface of at least one module of the plurality of modules.

10. The indexed inline substrate processing tool of claim 1, further comprising:
a load module disposed at a first end of the indexed inline substrate processing tool to provide the substrate carrier to the indexed inline substrate processing tool; and
an unload module disposed at a second end, opposite the first end, of the indexed inline substrate processing tool to remove the substrate carrier from the indexed inline substrate processing tool.

11. The indexed inline substrate processing tool of claim 1, further comprising:
a cleaning module disposed between after the last module of the plurality of modules and before the first module of the plurality of modules to clean the substrate carrier.

12. The indexed inline substrate processing tool of claim 1, wherein the gas inlet comprises:
a first set of gas orifices configured to provide a jet flow of process gases; into the enclosure; and
a second set of gas orifices configured to provide a laminar flow of process gases into the enclosure.

13. An indexed inline substrate processing tool comprising:
a substrate carrier having:
a base disposed horizontally along a bottom portion of the indexed inline substrate processing tool, wherein the base includes:
a channel formed in a bottom surface of the base;
a hole formed in a top surface of the base and fluidly coupled to the channel to form a path for one or more gases to flow through the base; and
a conduit formed within the base circumscribing the channel to provide a cleaning gas to the channel; and
a pair of opposing substrate supports having respective substrate support surfaces that extend upwardly and outwardly arranged in a "v" shape from a top surface of the base, wherein each of the pair of opposing substrate supports is only supported along a bottom portion of the substrate support; and
a plurality of modules coupled to one another in a linear arrangement, wherein each module of the plurality of modules comprises an enclosure having a first end, a second end, and a lower surface to support the substrate carrier and to provide a path for the substrate carrier to move linearly through the plurality of modules from a first module of the plurality of modules, through any intervening modules, to a last module of the plurality of modules, and wherein at least one module of the plurality of modules comprises:
a window disposed in a side of the enclosure to allow radiant heat to be provided into the enclosure;
a heating lamp coupled to the side of the enclosure to provide radiant heat into the enclosure through the window;
a gas inlet disposed proximate a top of the enclosure to provide a process gas into the enclosure; and
an exhaust disposed opposite the gas inlet to remove the process gas from the enclosure.

* * * * *